(12) United States Patent
Yamaguchi et al.

(10) Patent No.: US 7,307,253 B2
(45) Date of Patent: Dec. 11, 2007

(54) SCANNING ELECTRON MICROSCOPE

(75) Inventors: Kohei Yamaguchi, Hitachinaka (JP); Seiji Isogai, Hitachinaka (JP); Kazuo Aoki, Hitachinaka (JP); Masashi Sakamoto, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 277 days.

(21) Appl. No.: 11/211,650

(22) Filed: Aug. 26, 2005

(65) Prior Publication Data

US 2006/0043294 A1 Mar. 2, 2006

(30) Foreign Application Priority Data

Aug. 30, 2004 (JP) ............................. 2004-249435

(51) Int. Cl.
*H01J 37/256* (2006.01)
*G01N 23/00* (2006.01)
(52) U.S. Cl. .................. 250/310; 250/311; 250/306; 250/396 R; 250/492.1; 250/492.2
(58) Field of Classification Search .................... None
See application file for complete search history.

(56) References Cited

U.S. PATENT DOCUMENTS 6,333,510 B1 * 12/2001 Watanabe et al. ...... 250/559.27
6,657,221 B2    12/2003 Nakagaki et al.
2005/0173633 A1 * 8/2005 Tanaka et al. ............... 250/311
2005/0236569 A1 * 10/2005 Yamaguchi et al. ........ 250/311

FOREIGN PATENT DOCUMENTS

| JP | 5-3013 | 1/1993 |
| JP | 11-297253 | 10/1999 |
| JP | 2002-310962 | 10/2002 |

* cited by examiner

*Primary Examiner*—Nikita Wells
(74) *Attorney, Agent, or Firm*—Dickstein Shapiro LLP

(57) ABSTRACT

In a scanning electron microscope having the function of observing an attentional object on a specimen, an error in an in-focus position can be corrected at high speeds. When moving the field of view to an object to be observed on a specimen on which an electron beam is scanned, an error between an in-focus position indicated by a mechanism for measuring a height of surface of the specimen and an actual in-focus position is corrected on the basis of information concerning points which are among a plurality of measured points and are adjacent to the target observing point.

10 Claims, 7 Drawing Sheets

SCANNING ELECTRON MICROSCOPE

BACKGROUND OF THE INVENTION

The present invention relates to a scanning electron microscope capable of observing a minute measuring object present on the surface of a specimen.

Microscopes using a probe of charged particles, including a scanning electron microscope, have been used for observation of a fine structure of a specimen in the field of research and development. In the scanning electron microscope, an SEM (scanning electron microscope) image of an observing object desired for observation is displayed on the screen. This technology is applied to observation of a fine structure of a semiconductor device and is indispensable for production process. In recent years, minuteness of the semiconductor device has been advancing and at present, a semiconductor device having a pattern width of 100 nm or less has been fabricated. In the semiconductor device as above, even in the presence of a foreign matter or defect of about several of tens of nanometers on a wafer on which a semiconductor pattern is formed, a fault will sometimes occur. With the object of examining in detail foreign matters or defects responsible for faults, observation and image-pickup of the foreign matters or defects with the scanning electron microscope or the like is often conducted. Available as this type of apparatus is a defect inspection apparatus or an inspection apparatus called a review SEM.

Supposedly, such an inspection apparatus as above is placed in the production line of semiconductor device and brought into unattended operation. Further, to assist in speeding up inspection, individual processing times need to be as short as possible and an image must be picked up at high speeds. When picking up a clear image removed of focus blur, it is general to make focus adjustments automatically by using the function of, for example, autofocus and then pick up images. In the case of the scanning electron microscope, a method is often employed for autofocus, according to which while changing the focal position, an electron probe is irradiated synchronously with scanning of display and a focal position is calculated on the basis of obtained signals such as secondary electron signals. In an exemplary method of this type, the focal position is changed to obtain images at individual focal positions, the thus obtained images are processed through a high-pass filter and intensities of the filtered images are plotted on a graph to determine an in-focus position corresponding to a maximally intensive point. In this procedure, data is acquired while moving the focal position and therefore this process is time-consuming. For efficient inspection, it is necessary that the time consumed for autofocus be as short as possible, the number of autofocus operations be reduced and many defects be picked up within a short period of time. For reduction of the number of autofocus operations, a method has been known in which the wafer surface height is detected with an optical type height detector and focus of an SEM is settled on the basis of a detected surface height (for example, see JP-A-2002-310962 (U.S. Pat. No. 6,657,221). In the electron microscope, however, an electron beam is used as a probe and consequently, the wafer surface will sometimes be charged and under the influence of charged electricity, the trajectory of electrons will sometimes be deflected, so that electrons cannot be focused on a scheduled point and a defocus results, giving rise to a blurred image. The charged electricity cannot be measured with the height detector and causes a serious problem during image pickup. A technique aiming at correction of the defocus has been known in which before measurement, a value of charged potential on a wafer is measured with an electrostatic meter and a defocus presumable from a quantity of charged electricity is corrected or in-focus positions are measured in advance at several locations on the wafer, thus preparing a curved surface for interpolation and then the current value of an objective lens is controlled in accordance with the curved surface to thereby reduce the number of autofocus operations (see JP-A-05-003013, for example). But, in these conventional techniques, as the electric charge condition changes with time, correction cannot sometimes be made successfully by merely using initially acquired data.

SUMMARY OF THE INVENTION

An object of the present invention is to correct an error in in-focus position at high speeds in an electron microscope having the function of observing an attentional object on a specimen.

According to an embodiment of the invention, to accomplish the above object, when the field of view is moved up to an object to be observed on a specimen on which an electron beam is scanned in a scanning electron microscope, an error between an in-focus position indicated by a mechanism for measuring a height of surface of the specimen and an actual in-focus position is corrected on the basis of information concerning points which are among a plurality of measurement points and are adjacent to the target observing point.

According to the invention, in the scanning electron microscope having the function of observing an attentional object on the specimen, an error in in-focus position can be corrected at high speeds.

Other objects, features and advantages of the invention will become apparent from the following description of the embodiments of the invention taken in conjunction with the accompanying drawings.

DETAILED DESCRIPTION OF THE EMBODIMENTS

A method of correcting a height sensor value and an in-focus position of an electron microscope according to an embodiment of the invention will be described.

Figure 2:
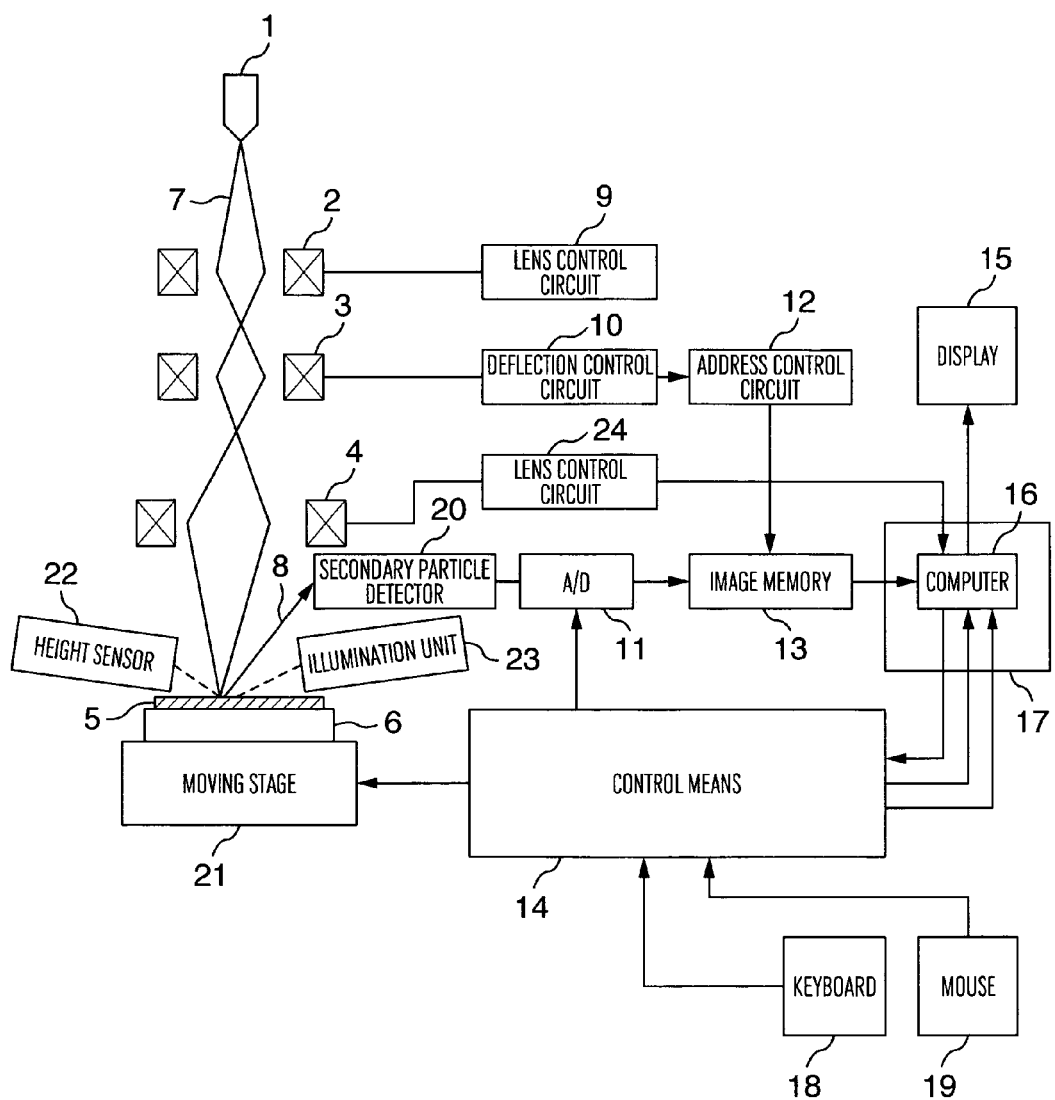
FIG. 2 is a longitudinal sectional view showing the principal construction of a scanning electron microscope.

Referring first to FIG. 2, a scanning electron microscope according to the invention is constructed as shown in longitudinal sectional form. The following description will be given by way of the scanning electron microscope but a microscope using another kind of charged particles can adopt a similar method. In addition, a plurality of image pickup units may be used in combination. For example, an image of a bright field or dark field optical system can be used when selecting specified several points initially and thereafter an SEM image can be used. These types of images may be combined at discretion. The scanning electron microscope shown in FIG. 2 comprises an electron gun 1, an electron lens 2, a lens control circuit 9, a deflector 3, a deflection control circuit 10, an objective lens 4, an objective lens control circuit 24, a secondary particle detector 20, an analog/digital converter 11, an address control circuit 12, an image memory 13, a control means 14, a display 15, a computer 16 and an image synthesis means 17. Input means such as keyboard 18 and mouse 19 are connected to the microscope. In the figure, a column for maintaining the optical system components in vacuum is omitted.

An electron beam 7 emitted from the electron gun 1 representing an electron beam generation source is condensed by the electron lens 2, scanned and deflected two-dimensionally by the deflector 3 and thereafter focused by the objective lens 4 so as to be irradiated on a specimen 5. The objective lens referred to herein may be of either excitation type or electrostatic type and besides may be of another mechanism provided that it can deflect the trajectory of charged particles and focus them on the specimen surface. In the following, they are named generically the objective lens.

When the electron beam 7 is irradiated on the specimen 5, secondary particles 8 such as reflected electrons and secondary electrons are generated in accordance with shape and material of the specimen. The secondary particles 8 are detected and amplified with the secondary particle detector 20 and converted into a digital value by means of the analog/digital converter 11. Data in the form of the converted digital value is stored in the image memory 13. As addresses of the image memory 13 at that time, addresses synchronous with a signal for scanning the electron beam are generated by means of the address control circuit 12. The image memory 13 transfers on occasion stored image data of SEM images to the image synthesis means 17. The image synthesis means 17 synthesizes picture data of a display memory of the computer 16 with the image data to display a resultant image on the display 15 on real time basis.

The specimen 5 to be observed with the scanning electron microscope is held by a specimen stage 6. A moving stage 21 responds to a control signal from the control means 14 to perform two-dimensional parallel movement of the specimen stage, thereby ensuring that the position at which the specimen 5 is scanned with the electron beam 7 can be changed. The scanning electron microscope is provided with a specimen height sensor 22. The sensor 22 can measure a physical wafer surface height at an observing portion when light such as a laser beam or rays of white light is irradiated from an illumination unit 23 onto the wafer surface and reflected light is moved as the wafer surface height changes. The wafer surface height may be measured through a method other than that of the specimen height sensor. The above method is not limitative and either a contact type height detection method or a non-contact type height detection method may be employed provided that it is based on a mechanism capable of measuring the physical height of the wafer surface.

Focus adjustments to the electron microscope are made using the objective lens 4. When moving the view field to an observing location by means of the moving stage 21, a physical height of the wafer surface is measured with the height sensor 22. Height data is sent to the computer 16. The computer calculates a current value of objective lens 4 necessary for focusing the electron beam on the height measured position and sets the current value. The computer 16 can store data concerning the location to be observed. In addition, the computer can also store and read pieces of data as to whether the height has been detected and other pieces of data concerning a height calculated by the height measuring mechanism, an actual in-focus position, coordinates of the measuring point and order of observation. Normally, in connection with the information, the observing location is identified in advance by means of another apparatus in order that the information can be utilized through the medium of a network or the information can be inputted to the computer 16 either directly from the observation results or from an external memory unit by way of a recording medium such as an electronic recording medium transcribing data the user has prepared at discretion by using an input unit such as mouse or keyboard or another unit.

Figure 1A:
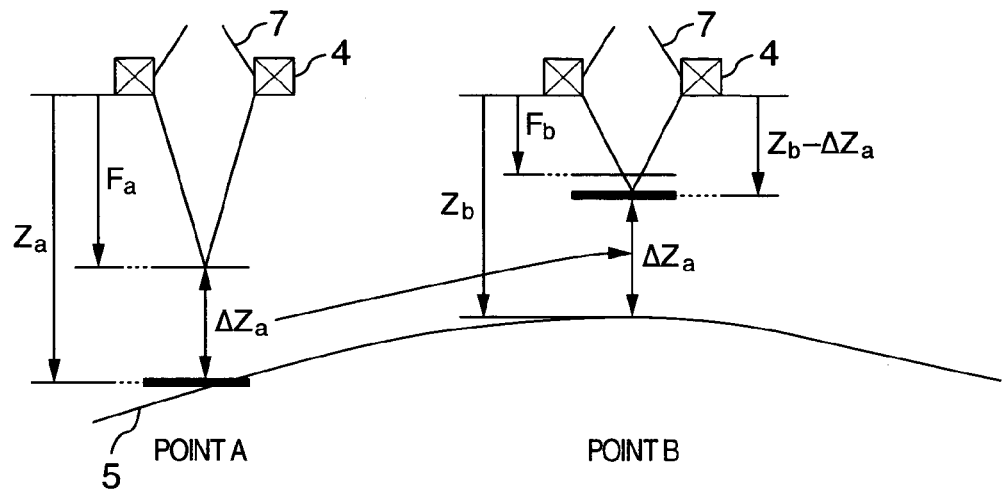
FIG. 1A is a side view for explaining the principle of the invention by showing portions of a wafer on which an electron beam is irradiated.
Figure 1B:
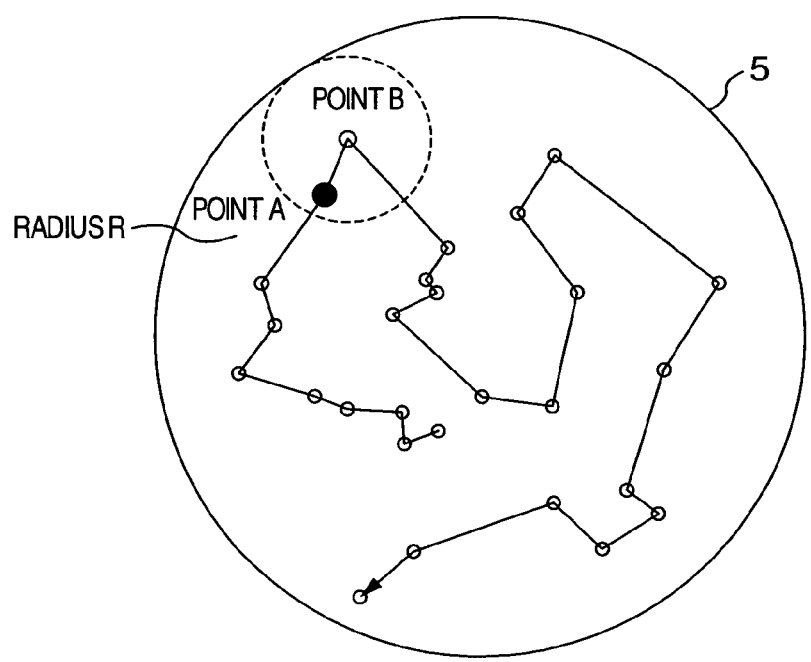
FIG. 1B is a plan view of the wafer in FIG. 1A.

Turning now to FIGS. 1A and 1B, the principle of the present invention will be described. Portions on a wafer where an electron beam is irradiated are illustrated in side view form in FIG. 1A and the wafer is illustrated in plan view form in FIG. 1B. At two mutually proximate points, quantities of charged electricity on the wafer surface are substantially equal to each other and therefore an error between a value measured by the height sensor and an in-focus position of the electron microscope is substantially the same. This feature will be utilized. Firstly, the view field is moved to a measuring point (point B in FIGS. 1A and 1B) and when a point which has already been measured (point A in FIGS. 1A and 1B) exists in a range of radius R from the point A, an error $\Delta Z_a$ ($=Z_a-F_a$) between height sensor value and in-focus position of the electron microscope at the already measured point is calculated and is added to a height value $Z_b$ at the measuring point calculated by the height sensor to correct the in-focus position of the electron microscope to $Z_b-\Delta Z_a$ at the measuring point. The measured point referred to herein was subjected to measurement and image-pickup in the past and an exact in-focus position at that point was known and settled by using autofocus. In the absence of any already measured point, autofocus is to be executed to calculate an in-focus position ($F_b$). This can eliminate the necessity of execution of autofocus at all points and the number of autofocus operations can be reduced considerably, leading to a reduction in time. Especially, when a great number of defects are inspected with the review SEM, the mean distance between adjacent defective points is relatively small and the above method is specifically effective. In case there are a plurality (n) of already measured points in close proximity to a measuring point, an error in in-focus position at the measuring point can be estimated from a mean $(\Sigma \Delta Z_i)/n$ of errors in in-focus position at the individual already measured points.

Further, by choosing an error $\Delta Z$ in in-focus position at an already measured point under a predetermined condition, the accuracy of correction can further be improved. For example, by using a condition that data acquired a predetermined time earlier is not used or a condition that data acquired at a constantly distant point is not used, a correction value more meeting an observing point can be calculated. Furthermore, when information for error estimation is utilized to select a path which can minimize an estimation value of error, the reliability of correction error can be promoted and still more effective correction can be made. Incidentally, when a path which enables making a round of all measuring points to be done by way of substantially the shortest distance is selected, the view field can be moved in such a manner that many already measured points can be included in proximity of a measuring point and this path can be considered as one of the effective paths.

In addition, by taking advantage of information accompanying an already measured point or anticipation information concerning the electron microscope and specimen and choosing a method for calculation of a correction value, more pertinent correction can be made. For example, conceivable are an example in which an error $\Delta Z$ in in-focus position at an already measured point is weighted in accordance with a degree of denseness between the already measured point and an observing point, an example in which when a standard deviation of errors $\Delta Z$ in in-focus points at already measured points exceeds a constant value, data having a large deviation is excluded and a mean value is calculated and an example in which a physical knowledge as expressed by the following equation (1) is utilized to calculate a correction value pursuant to this equation.

$$f(x,y)=a_1+a_2x^2+b_2y^2+a_4x^4+b_4y^4 \quad (1)$$

In another method, an error in correction value of its own can be calculated using the in-focus position estimating function and data of measuring points. More specifically, at each already measured point, at least an in-focus position $F_i$ determined through autofocus, an in-focus position $Z_i$ indicated by the height sensor and a height correction value $\Delta Z_i = f(F_k - Z_k)$ where (k< >i) calculated through the in-focus point estimating function are known and it can therefore be determined how many % error a height correction value $\Delta Z_i$ calculated from these numerical values contains. Accordingly, by taking advantage of this information, the estimation error value calculated by the aforementioned in-focus position estimating function can further be corrected. In case the reliability of the estimation error value is determined to be low, the estimation error value may be used as a condition for making a decision on the sequence as to, for example, interruption of correction and erase of all histories leading to recommence of data acquisition.

Incidentally, in the method set forth so far, the number of operations can be reduced but because a true value of height needs to be determined, autofocus is necessary to a slight extent. On executing the autofocus on the basis of the aforementioned sequence, the in-focus position correcting function and the correction value error estimating function of the in-focus position correction function may be used singularly or in combination to narrow down the search range of in-focus position in autofocus. More particularly, when executing autofocus, focusing is moved to a focal position corrected precedently by the in-focus position correcting function and then it is estimated, by the correction value error estimating function, how much an in-focus position is distant from a focal position moved from the precedently corrected focal position, thereby settling a search range in anticipation of safety factor. In this manner, the search range need not be widened unnecessarily and consequently, time can be shortened even when autofocus is used.

Embodiment 1

Figure 3:
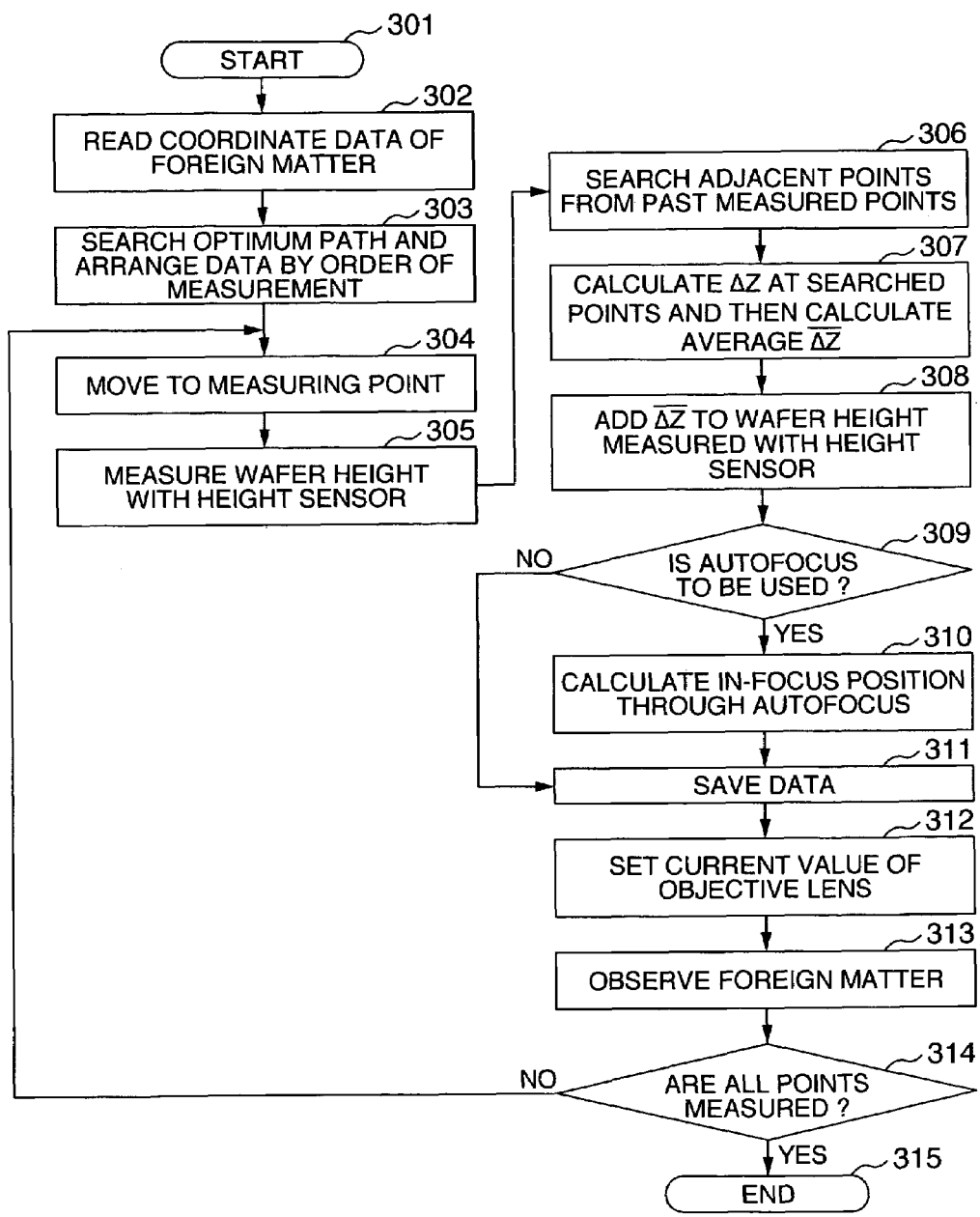
FIG. 3 is a flowchart for explaining a procedure of observing a foreign matter on the wafer according to a first embodiment.

Referring to FIG. 3, a flowchart shows a procedure of observing an attentional object on a wafer. A description will be given in sequence starting from step 301. Firstly, in step 302, data concerning a measuring point is read out of the computer 16. Next, in step 303, substantially the shortest path or route for making a round of all points is calculated from a list of the location to be measured. Substantially the shortest path can be calculated in various ways but it is not always the shortest distance in theory and any method capable of providing a shorter total moving distance as compared to a distance randomly selected can be employed. This step is not always necessary but preferably it may be executed for improving accuracy.

On the basis of the measurement sequence calculated in the step 303, movement to respective points is executed in step 304. Concurrently, the height sensor is activated in step 305 to measure a physical height $Z_i$ of wafer surface at a location desired to be measured. Next, in step 306, already measured points distant from the observing point within a predetermined range are searched. If the result of search indicates that already measured points exist, a mean value of differences between output values $Z_k$ of the height calculating mechanism and actual in-focus position values $Z_k$ at the individual already measured positions is calculated in step 307. The number of the already measured points involved is set to n. The already measured point referred to herein signifies a point for which a true value of in-focus position is made to be known through autofocus. Alternatively, values calculated precedently are saved in a database and they may be quoted. The number of points to be quoted is not particularly limited but by attaching a predetermined condition, for example, on a condition that when the number of points is large, points up to n-th one in order of closer distance are quoted, the accuracy can be improved to advantage. But such conditioning is not limitative. If no corresponding point is involved, the value is rendered to be zero or the value may preferably be set to a $\Delta Z_k$ measured earlier than the current observing point.

Subsequently, in step 308, the mean value obtained in the step 307 is added to an output value of the height calculating mechanism. Then, on the basis of the calculated value, the current value of the objective lens is adjusted in step 308. The relation between a focal position of the objective lens and an output value of the height calculating mechanism is calculated in advance and the current value of the objective lens is calculated pursuant to the relation to provide a value to be used. To explain in connection with FIG. 1A, a value of current corresponding to $Z_b - \Delta Z_a$ is set. In this manner, an error between an in-focus position delivered out of the height calculating mechanism and an actual in-focus position of the electron microscope is corrected.

Thereafter, it is decided also in the step 309 whether the autofocus is to be used and in the case of use of autofocus, the program proceeds to step 310 in which an in-focus position is determined using autofocus. After the in-focus position has been calculated, data at the observing point is recorded in the computer 16 in step 311. If no adjacent point is found in the step 306, it is desired that autofocus be carried out without exception. Enumerated as pieces of the recoded data are in-focus position, wafer surface height calculated by the height calculating mechanism, correction amount at the observing point, coordinate value thereof and time of image pickup. As necessary, information to be recorded may be selected from the above data pieces or new information may be added. After saving of the data, the program proceeds to step 313 in which an image is picked up. If the autofocus is not to be used, the current value of the objective lens set in the step 308 remains unchanged and the program proceeds to the step 313 so as to pick up an image.

After completion of the image pickup, the program proceeds to step 314, in which it is decided whether all points have been picked up. If there are surplus image-pickup points, the program returns to-the step 304 to continue image pickup. After making a round of all points has been completed, the program proceeds to step 315 and image pickup ends.

Embodiment 2

Figure 4:
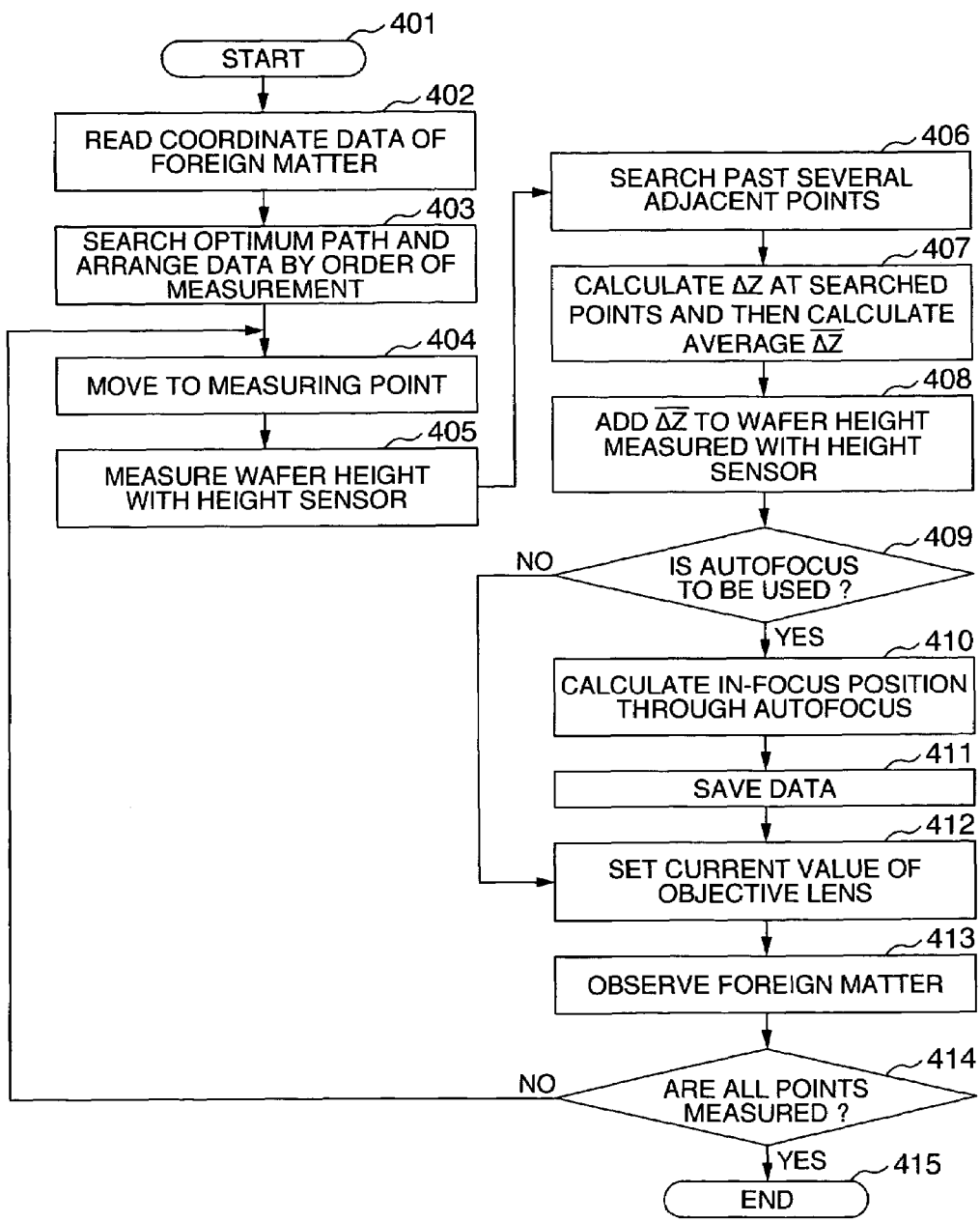
FIG. 4 is a similar flowchart according to a second embodiment.

The present embodiment differs from embodiment 1 in a method for selection of an observing point. Referring to FIG. 4, a flowchart shows a procedure of observing an attentional object on a wafer. Firstly, steps 401 to 405 are executed. Details of these steps are respectively similar to those of the steps 301 to 305 in embodiment 1 and will not be described herein. But, the step 403 is executed without fail in contrast to embodiment 1.

Next, in step 406, several already measured past points counted immediately from the observing point are searched. When the result of search indicates that the already measured points exist, a difference $\Delta Z_k$ between an output value $Z_i$ of the height calculating mechanism and a value $F_i$ of an actual in-focus position is calculated at each already measured point and a mean value of the errors is calculated in step 407. The mean value is determined from equation (2):

$$\overline{\Delta Z_k} = \frac{1}{n} \cdot \sum \Delta Z_k \quad (2)$$

Like the step 306 in embodiment 1, values calculated in advance and saved in the database may be quoted. The number of points to be quoted is not limited specifically but 3 to 4 points may be used. Also, like the step 306 in embodiment 1, a condition for choosing points used for correction may be attached as necessary. For example, by adding a condition that data measured earlier than a predetermined time is not to be used, the accuracy can be more improved. In case no corresponding points are involved, the value is preferably set to 0.

Thereafter, steps 407 to 415 are executed. Details of the respective steps are similar to embodiment 1 and will not be described herein.

Embodiment 3

Figure 5:
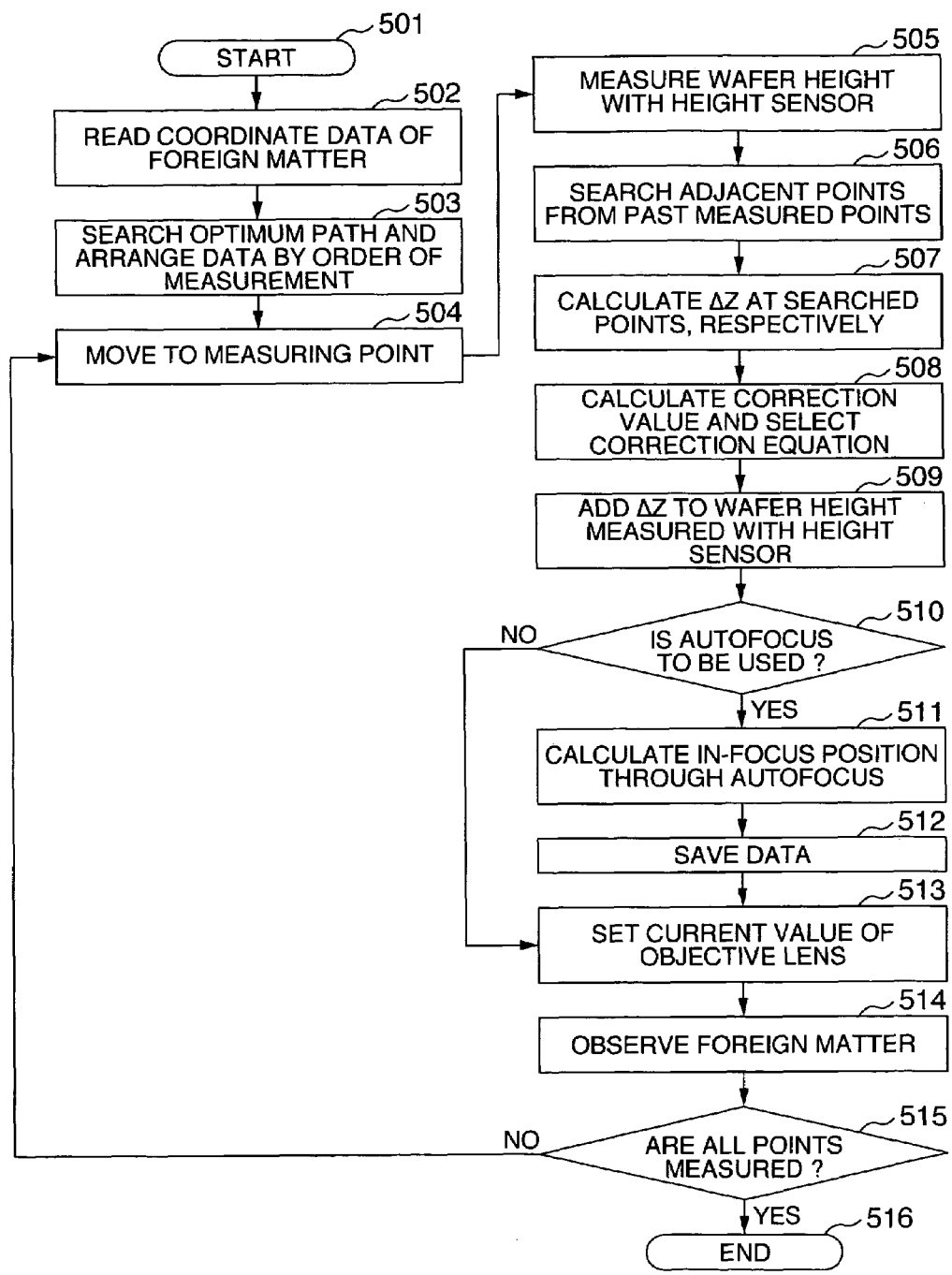
FIG. 5 is a similar flowchart according to a third embodiment.

Referring to FIG. 5, a flowchart shows a procedure of observing an attentional object on a wafer. In FIG. 5, steps 501 to 505 are first executed. Details of these steps are respectively similar to those of the steps 301 to 305 in embodiment 1 and will not be described herein.

Next, step 506 is executed. Details of this step are similar to those of the step 306 in embodiment 1 and will not be described herein. This step can be replaced with the step 406 in embodiment 2.

Subsequently, step 507 is executed, in which a difference $\Delta Z_k$ between an output value $Z_i$ of the height calculating mechanism at each already measured point searched in the step 506 and an actual in-focus position value $F_i$ is calculated. This step differs from the step 307 in embodiment 1 and the step 407 in embodiment 2 in that no mean value is calculated.

Next, in step 508, a correction amount is calculated. In this phase, conditional branching can be carried out on the basis of anticipation information concerning a specimen to select a method for calculation of the correction value. The anticipation information concerning a specimen may include information accompanying already measured points, past measurement history, measuring condition, measurement data, the number of already measured points and the kind of a wafer, a predetermined area on the wafer calculated from measurement history and the optical condition of electron microscope represented by current values and excitation quantities of the deflector, lens and electrode but this is not limitative. For calculation of the correction amount, in addition to the method for obtaining a mean value of difference values $\Delta Z_k$ calculated in the step 307 in embodiment 1, another method may be employed according to which a correction equation such as equation (1) is prepared, coefficients $a_i$ and $b_i$ in this equation are determined values x, y through the method of least squares, for instance, and a correction value at an observing point is calculated pursuant to the thus determined equation. Further, like the step 306 in embodiment 1, already measured points used for calculation of correction values can be chosen on a predetermined condition. As described above, by attaching a condition for calculation of correction values or providing branching as to methods, proper corrections complying with various conditions can be made. The condition for conditional branching, the correction equation and the condition elements described in the foregoing are mere examples and are not limitative.

The ensuing steps 509 to 516 are executed. Details of these steps are respectively similar to those of the steps 308 to 315 in embodiment 1 and will not be described herein.

Embodiment 4

Figure 6:
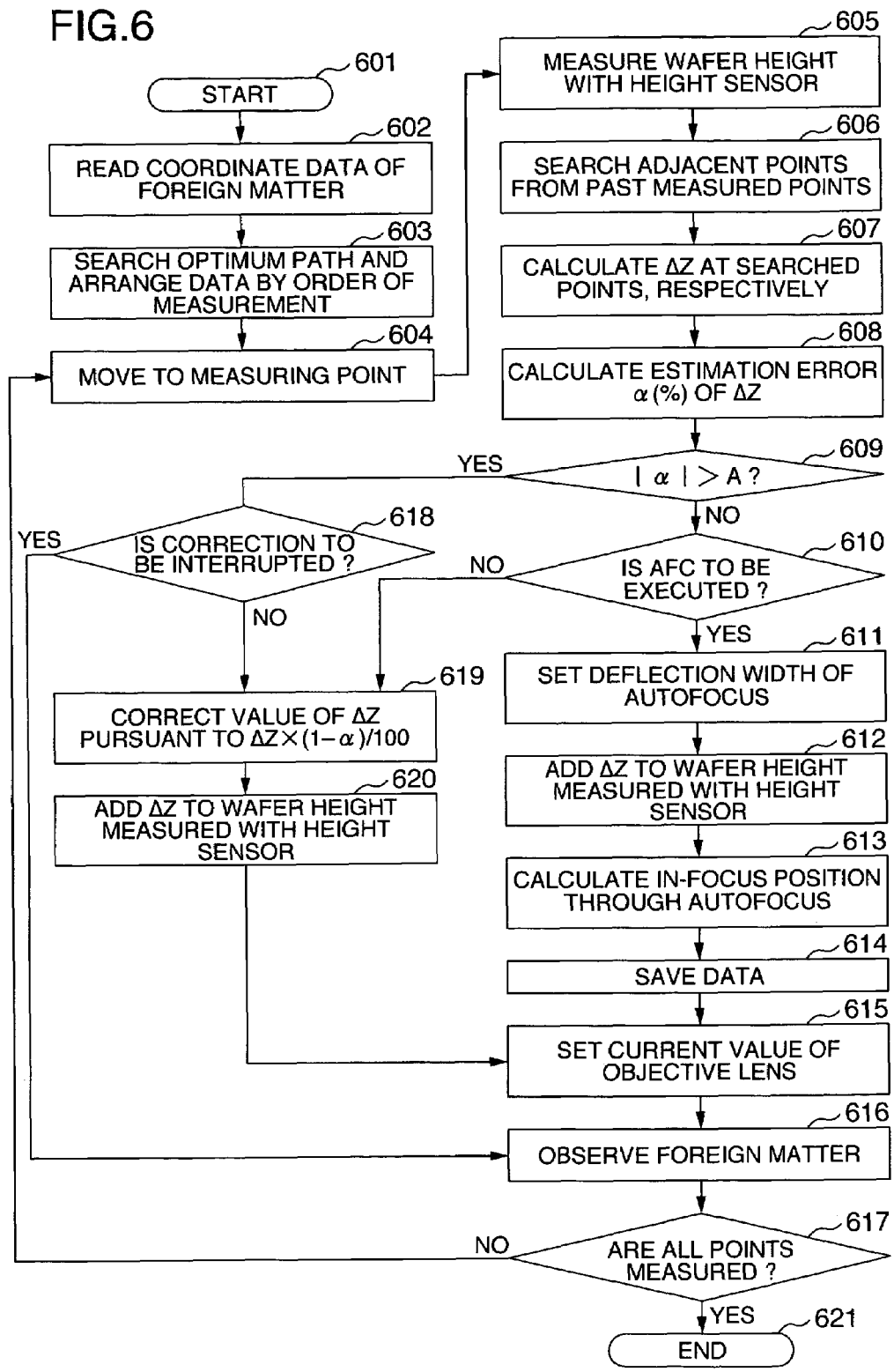
FIG. 6 is a similar flowchart according to a fourth embodiment.

Referring to FIG. 6, a flowchart shows a procedure of observing an attentional object on a wafer. In FIG. 6, steps 601 to 605 are first executed. Details of these steps are similar to those of the steps 301 to 305 in embodiment 1 and will not be described.

Next, step 606 is executed. Details of this step are similar to those of the step 306 in embodiment 1 and will not be described herein. This step can be replaced with the step 406 in embodiment 2.

Subsequently, step 607 is executed to calculate a correction value. Details of this step are similar to those of the step 307 in embodiment 1 and will not described. This step may be replaced with the step 507 or 508 in embodiment 3.

Figure 7:
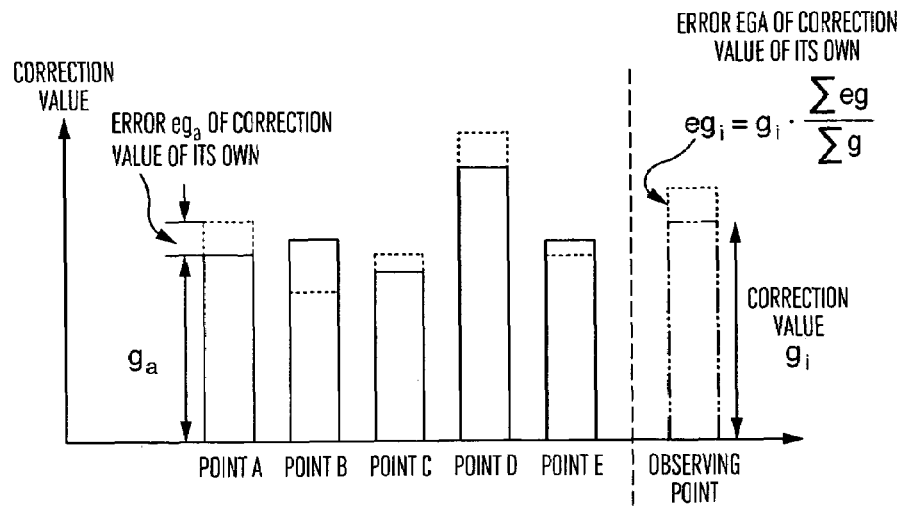
FIG. 7 is a correlation diagram for explaining a method of estimating an error a correction value involves per se.

Thereafter, in step 608, an error $\alpha(\%)$ the correction value itself calculated in the preceding step involves is estimated from data stored in the computer 16. This is calculated from errors and correction amounts at several or all of the already measured points. A correlation graph as shown in FIG. 7 is useful to explain a method of estimating an error included in the correction value of its own. Exemplarily, where in FIG. 7 a correction amount at a point A is $g_a$ µm and an error of $eg_a$ µm exists between an in-focus position after correction and an actual in-focus position, an error in the correction amount itself at the point A can be calculated as $eg_a/g_a \times 100$ (%). By utilizing this, an average of errors in the correction amounts themselves can be indicated as shown in equation (3) in respect of, for example, an already measured point of interest:

$$E_i = \frac{\sum eg}{\sum g} \quad (3)$$

In this manner, the error the correction amount itself involves can be estimated to be about $E_i \times 100(\%)$. The method for calculation of an error in the correction value of its own is not limited to the above and the error may be calculated through another statistical method using, for example, saved data. In case no already measured point exists or the number of already measured points is too small to obtain reliable data, $\alpha$ is preferably set to zero.

In the next step 609, it is decided whether $\alpha$ calculated in the step 608 exceeds a prescribed value A and the program branches in accordance with the magnitude of the value. In this example, it is assumed that when the estimation error $\alpha$ is large, making the correction without alteration is determined to be dangerous and branching to another means such as autofocus is taken. The above is a mere example and may be executed at discretion.

Figure 8:
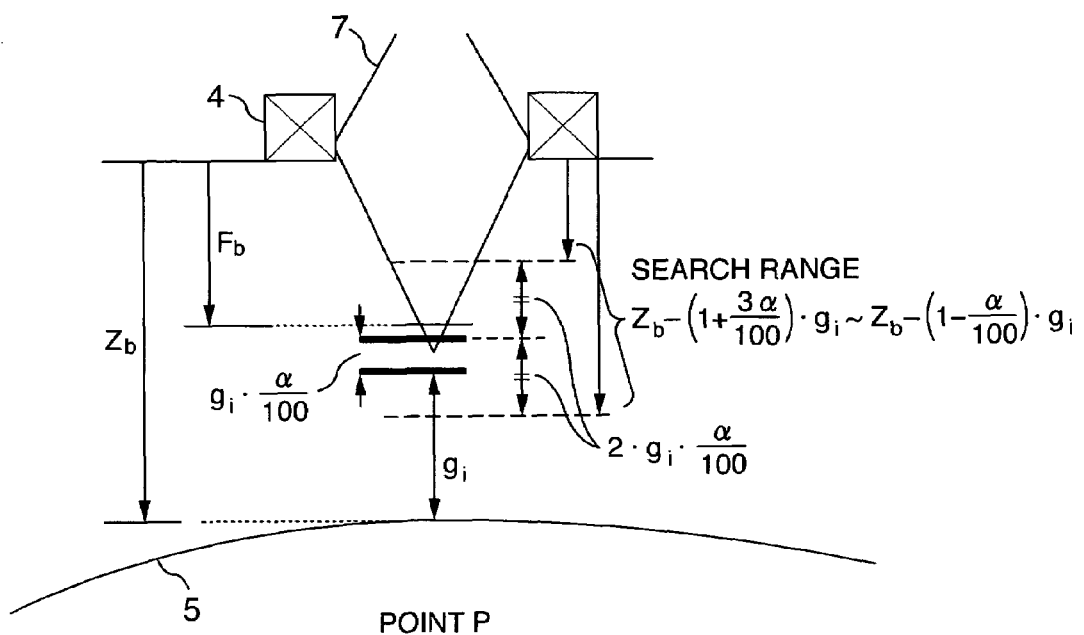
FIG. 8 is a side view for explaining a method of calculating a search range of in-focus position from an estimated error in a correction value itself by showing a portion irradiated with an electron beam.

If the estimation error $\alpha$ is determined to be less than the prescribed value A in the step 609, the program proceeds to step 610 to conduct branching conditioned by either execution or inexecution of autofocus. If YES, the program proceeds to step 611, in which a deflection width of autofocus, that is, a range of search for a focal position is determined from $\alpha$. Reference is made to FIG. 8 depicting a side view of a portion irradiated with an electron beam for explaining a method of calculating the range of search for an in-focus position from the estimation error in the correction value itself. In FIG. 8, when the error in the correction amount itself is estimated to be, for example, $\alpha\%$ and the correction amount at an observing point is $g_i$ μm, it can be estimated that an in-focus position is included before and after (focal position after correction)$+(\alpha/100) \times g_i$(μm). In connection with FIG. 8, a range is set as given by equation (4):

$$z_b - (g_i + \frac{\alpha}{100} \cdot g_i + \frac{\alpha}{100} \cdot g_i \cdot 2) \sim Z_b - \quad (4)$$
$$(g_i + \frac{\alpha}{100} \cdot g_i - \frac{\alpha}{100} \cdot g_i \cdot 2) \Leftrightarrow$$
$$Z_b - \left(1 + \frac{3\alpha}{100}\right) \cdot g_i \sim Z_b - \left(1 - \frac{\alpha}{100}\right) \cdot g_i$$

In equation (4), calculation is made by taking out of point P in FIG. 8 a range $(\pm 2\alpha/100) \times g_i$ which is twice an error amount of $(\alpha/100) \times g_i$. Within this range, an in-focus position can be specified substantially perfectly. In this manner, the search range can be calculated automatically from $\alpha$ without broadening the search range unnecessarily, thereby ensuring that the in-focus position can be searched within the proper search range. It will be appreciated that the above numerical values and equations are exemplarily given for illustration purpose only and actually, the aforementioned specifying range can be changed to a more pertinent value depending on the method for calculation of an in-focus position and the magnitude of values. In the foregoing description, the search range is calculated automatically but alternatively, several kinds of search ranges may be set in advance and a range can be selected in accordance with a value of $\alpha$.

After completion of setting of the search range in the step 611, step 612 is executed. In this step, calculation is conducted similarly to the step 308 in embodiment 1 but is meaningful for the purpose of making an in-focus position approach the central portion of the search range as closely as possible to thereby prevent the in-focus position from deviating from the search range. Accordingly, the center of the search range may preferably be set at this position. Next, in step 603, autofocus is carried out to calculate an in-focus position. Thereafter, steps 614 to 617 and step 620 are executed. Details of these steps are respectively similar to those of the steps 311 to 314 and step 315 in embodiment 1 and will not be described herein.

When the estimation error $\alpha$ is determined to exceed the prescribed value A in the step 609, the program proceeds to step 618 in which branching conditioned by either execution or inexecution of correction is carried out. A condition of interruption may be determined, for example, when the error is excessively large as indicated by $|\alpha|>B>>A$ or by depending on other measurement data or a measuring condition. Here, the estimation error $\alpha$ is used as a criterion of decision but the condition for interruption is not limited to it. For example, the magnitude of a change in correction value can be used as decision criterion. When the interruption is determined in the step 618, any correction is not made and the program proceeds to step 616 without alteration so as to observe a foreign matter. In this example, no correction is made and the focal position adjustment is carried out using a value of the height sensor. But processing of focal position after conditional branching is not limited to the above and an optimum decision can selectively be made in accordance with a situation by, for example, adding the previous correction value without alteration. In the case of making correction, the program proceeds to step 619. It is to be noted that the interruption condition in the step 618 may not be attached in the case shown in FIG. 6 but may be attached in another case.

Alternatively, the correction value calculated in the step 607 can be so modified that the correction value itself is modified using the correction error estimation function in the step 619. For example, when a is estimated to be 5% in the step 608, a more accurate correction can be made by multiplying the calculated correction value by 0.95. The above operation is a mere example and correction can be made using another statistical method. This is not always necessary and execution thereof may be done at discretion.

Thereafter, step 620, steps 615 to 617 and step 621 are executed. The step 620 is similar to the step 612 and the steps 615 to 617 and step 621 are similar to the steps 312 to 314 and step 315 in embodiment 1 and these steps will not be described herein.

As described above, according to the foregoing embodiments of the invention, an error between an in-focus position outputted from the height calculating mechanism and an actual in-focus position of the electron microscope can be corrected to thereby correct an error in in-focus position at high speeds.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope comprising:
means for correcting, when the field of view is moved to an object to be observed on a specimen, an error between an in-focus position indicated by a mechanism for measuring a height of surface of said specimen and an actual in-focus position on the basis of information concerning points which are among a plurality of measuring points and are adjacent to the target observing point.

2. A scanning electron microscope according to claim 1, wherein said information concerning adjacent points includes said error.

3. A scanning electron microscope according to claim 1, wherein said means for correcting an error calculates a mean value of the errors in respect of points observed earlier than said observing point to provide a correction amount and correcting said error at said observing point by using the correction amount.

4. A scanning electron microscope according to claim 1, wherein said means for correcting an error corrects said error at said observing point by determining the order of observation in such a manner that a route for making a round of all of said measuring points is substantially minimized and calculating a mean value of errors at several past points measured earlier than the observing point to provide a correction amount.

5. A scanning electron microscope according to claim 4, wherein said means for correcting an error has the function of choosing, under a predetermined condition, errors from ones at points which are used when calculating the correction amount and are observed earlier than said observing point.

6. A scanning electron microscope according to claim 5, wherein said means for correcting an error has the function of choosing a condition or a method for calculation of the correction amount used for correction of the error at said observing point by taking advantage of anticipation information concerning said specimen.

7. A scanning electron microscope according to claim 6, wherein said means for correcting an error has the function of estimating an error included in said correction amount per se.

8. A scanning electron microscope according to claim 7, wherein a range within which said in-focus point is included is estimated or automatically calculated on the basis of the estimated error included in the correction amount per se.

9. A scanning electron microscope according to claim 8, wherein said means for correcting an error has the function of modifying the correction amount at said observing point on the basis of the estimated error included in the correction amount per se.

10. A scanning electron microscope according to claim 9, wherein said means for correcting an error has the function of interrupting the correction temporarily or ending it under a predetermined condition.

* * * * *